United States Patent [19]
Fischer

[11] Patent Number: 5,300,837
[45] Date of Patent: Apr. 5, 1994

[54] DELAY COMPENSATION TECHNIQUE FOR BUFFERS

[75] Inventor: Jonathan H. Fischer, Blandon, Pa.

[73] Assignee: AT&T Bell Laboratories, Murray Hill, N.J.

[21] Appl. No.: 946,990

[22] Filed: Sep. 17, 1992

[51] Int. Cl.⁵ .......................... H03K 3/01; G06G 7/10
[52] U.S. Cl. .................................. 307/491; 307/296.6; 307/296.8; 307/594; 307/597; 307/603; 307/605
[58] Field of Search ............... 307/491, 591, 443, 451, 307/296.6, 296.8, 594, 597, 603, 605

[56] References Cited

U.S. PATENT DOCUMENTS

| | | | |
|---|---|---|---|
| 4,791,326 | 12/1988 | Vajdic et al. | 307/571 |
| 5,101,117 | 3/1992 | Johnson et al. | 307/269 |
| 5,164,621 | 11/1992 | Miyamoto | 307/591 |
| 5,179,297 | 1/1993 | Hsueh et al. | 307/296.6 |

FOREIGN PATENT DOCUMENTS 2221587  2/1990  United Kingdom ............... 307/591

OTHER PUBLICATIONS

Johnson et al., "A Variable Delay Line Phase Locked Loop for CPU-Coprocessor Synchronization," 1988 IEEE International Solid-State Circuits Conference, Feb. 18, 1988, pp. 142-143.

Primary Examiner—Margaret R. Wambach
Attorney, Agent, or Firm—David L. Smith

[57] ABSTRACT

An integrated circuit has a signal path including a first circuit that introduces a propagation delay that decreases with circuit conditions and process speed in series with a second circuit that introduces a propagation delay that increases with circuit conditions and process speed. The circuit conditions and process speed are sensed and the duration of the propagation delay of the second circuit varied such that the total propagation delay remains within a predetermined range over circuit condition and process speed variations. In another embodiment of the invention, a current source develops a bias current to control the duration of the propagation delay of the second circuit. In yet another embodiment of the invention the current source is a current mirror.

15 Claims, 4 Drawing Sheets

DELAY COMPENSATION TECHNIQUE FOR BUFFERS

TECHNICAL FIELD

This invention relates generally to integrated circuits having delay compensation and particularly to integrated circuits which compensate the delay of a buffer to be within a predetermined time range.

BACKGROUND OF THE INVENTION

In integrated circuits, logic signals must arrive at an appropriate time to be properly read. This requires that the logic signals must be properly timed with respect to pulses that initiate transferring the signals such as to or from a bus. Prior to being placed on a bus, the logic signals may be buffered to assure being placed on the bus at the appropriate time. When the buffer is strobed to initiate data transfer, the switching speed of logic devices in the signal path contribute to a propagation delay. One problem is that the propagation delay may vary over a relatively large range due to variations in operating conditions such as effects of temperature, supply voltage, and device parameter variations during manufacture of the integrated circuit.

One solution has been to add a fixed time delay component to the buffer such that the total propagation delay falls within the desired time range. While this solution will suffice in some applications, it is not adequate for all applications.

Another solution uses feedback in the form of a phase or delay locked loop to adjust the propagation delay of a circuit to track the period of a reference clock. The disadvantage of this solution is the need for the feedback control loop and reference clock.

U.S. Pat. No. 4,791,326 discloses another solution in which switching characteristics of a transistor are maintained nearly uniform as circuit and process variations cause switching conditions to change. A compensated current source controls the peak switching current through a switching transistor to be fairly constant under all switching conditions to control the switching transition time (propagation delay) introduced by the transistor. The switching characteristics are maintained nearly uniform as circuit and process variations cause switching conditions to change, resulting in a nearly uniform propagation delay. However, this approach suffers from the drawback that the compensation circuit does not sense all of the circuit conditions and process speed variations that influence propagation delay.

An improved propagation delay compensation technique is desired that senses the circuit conditions and process speed variations that influence propagation delay in a signal path switching device and provides a control signal incorporating effects of the sensed parameters, such as in the form of a bias current, to produce a variable delay with the result that the total propagation delay in the signal path is controlled to be within an acceptable, predetermined range.

SUMMARY OF THE INVENTION

In accordance with an embodiment of the present invention, an integrated circuit has a signal path including a first circuit in series with a second circuit. The first circuit introduces a propagation delay that decreases when circuit conditions and process speed result in increased circuit speed whereas the second circuit introduces a propagation delay that increases with the same conditions. The total propagation delay remains within a predetermined range over circuit condition and process speed variations. In another embodiment of the invention, a current source develops a bias current to control the duration of the propagation delay of the second circuit. In yet another embodiment of the invention the current source is a current mirror.

DETAILED DESCRIPTION

Figure 1:
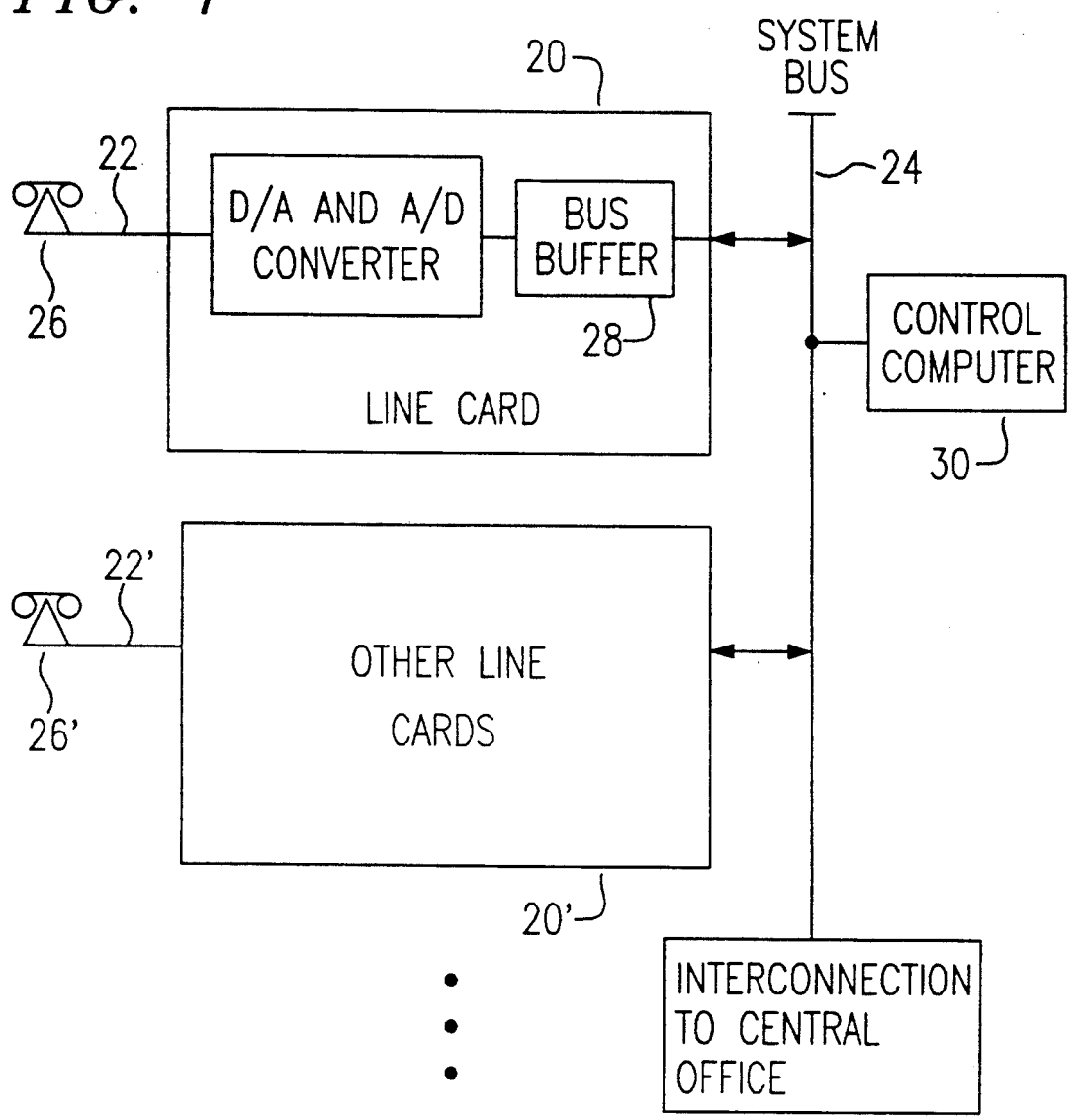
FIG. 1 is a block diagram showing an environment in which an embodiment of the invention may be used.

An overview of the environment of integrated circuits employing one embodiment of the invention is shown in FIG. 1. A private business exchange (PBX) utilizes a line card 20 interface between a telephone line 22 and a system bus 24. Line card 20 operates bidirectionally, in one direction to receive an analog signal from telephone 26 on line 22, digitize the signal and output a pulse code modulated packet of data to system bus 24, and in the other direction to receive a packet of data from the system bus 24 and output an analog signal to telephone 26 on line 22. The packets of data pass through a bus buffer 28 before being placed on the system bus or before being converted from a digital signal to an analog signal when read from the bus. The bus buffer, a bidirectional device, interfaces line card 20 to the system bus. A typical PBX will have a multiplicity of telephones 26, 26' each tied to the system bus 24 through respective line cards 20, 20'. A control computer 30, also tied to the system bus, provides a master clock signal that determines when any particular line card reads to or from the system bus. When the master clock determines that it is the appropriate time for a particular line card to transfer data to or from the system bus, a logic inverter is triggered to change state. The system bus is interconnected to a central office.

Figure 2:
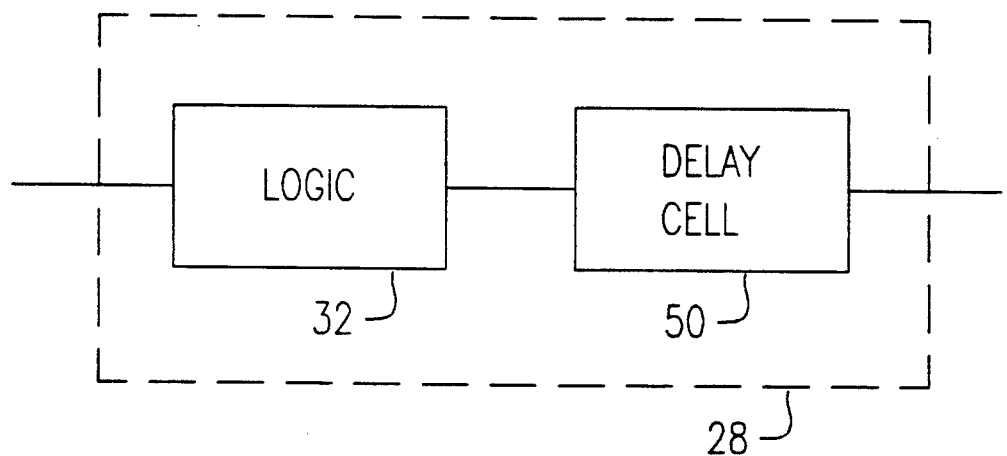
FIG. 2 is a block diagram illustrating the bus buffer of FIG. 1 in more detail.
Figure 3:
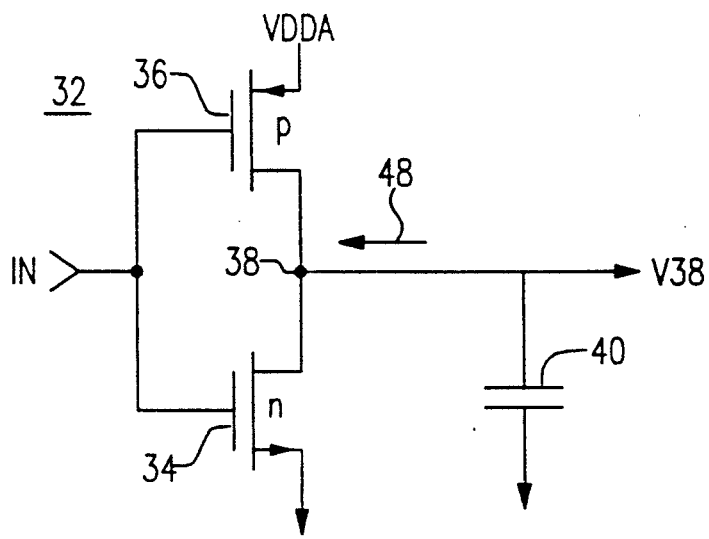
FIG. 3 is a schematic diagram showing a logic inverter.

FIG. 2 illustrates bidirectional bus buffer 28 which includes uncompensated logic 32 in series with a compensated time delay cell 50. An example of CMOS logic 32 is shown schematically in FIG. 3. The gate of n-channel transistor 34 is coupled to the gate of p-channel transistor 36 and receives an input signal to change state. The source of transistor 34 is coupled to ground. The source of transistor 36 is coupled to the power supply, VDDA. The drain of transistor 34 is coupled to the drain of transistor 36 and is designated node 38. A representative capacitance 40 is coupled between node 38 and ground. The capacitance represented by capacitor 40 is the sum of parasitic capacitances from the logic gates driven by logic 32 as well as routing parasitic capacitances.

Figure 5:
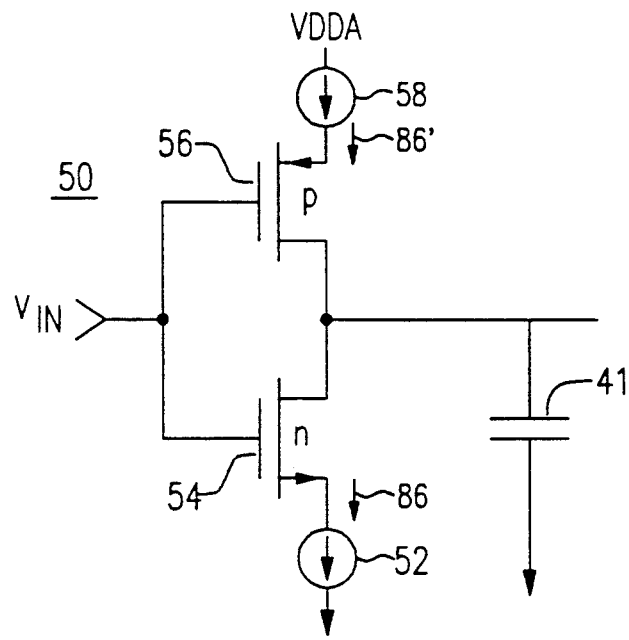
FIG. 5 is a schematic diagram of a simplified time delay cell.

Time delay cell 50, shown in FIG. 2 and in greater detail in FIG. 5, is an inverter similar in structure and operation to logic 32 and is coupled in series with logic 32. The gate of n-channel transistor 54 is coupled to the gate of p-channel transistor 56 and receives the output from logic 32, the voltage at node 38, as an input signal to change state. A current source 52 coupled between the source of transistor 54 and ground is used to control the discharge of capacitor 41. A corresponding current source 58 coupled between the source of transistor 56 and the power supply, VDDA, is employed to control the charging of capacitor 41. The drains of transistors 54 and 56 are coupled together and to ground through representative capacitance 41. The capacitance of capacitor 41 may differ from the capacitance of capacitor 40.

Figure 6:
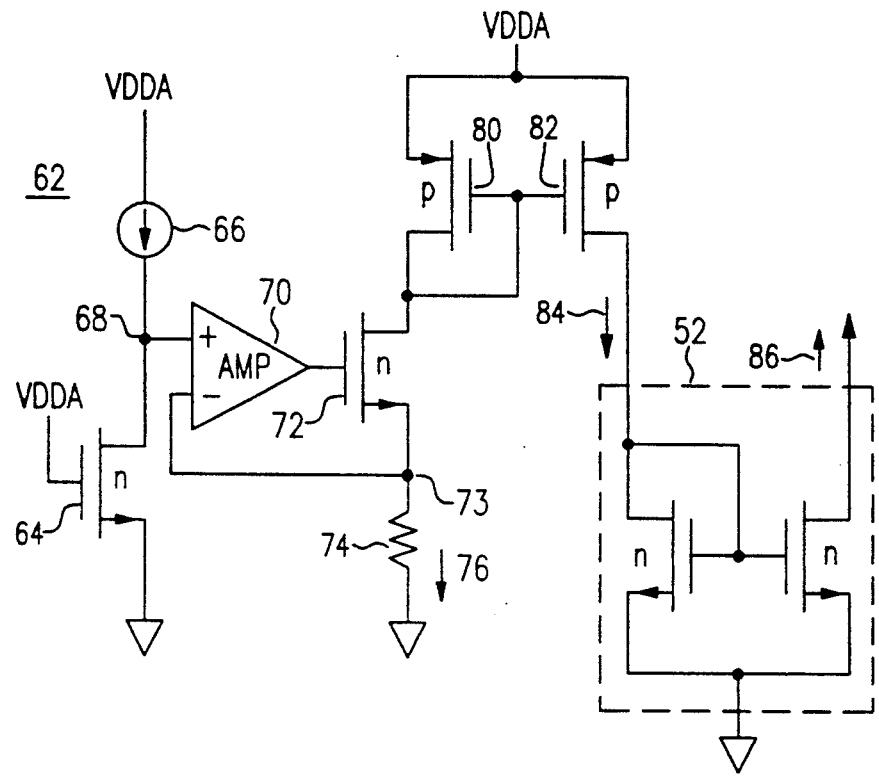
FIG. 6 is a schematic diagram showing the current bias.

Current source 52 is shown schematically in FIG. 6 as part of a modeling circuit 62 that models the operation of transistor 34. The gate of transistor 64, which may represent more than one transistor in series, is tied to the power supply. The drain of transistor 64 is coupled to current source 66. The source of transistor 64 is coupled to ground. A drain-to-source voltage is developed at node 68 due to bias current source 66 providing sufficient current to drive transistor 64. Current source 66 is sized based on the nominal propagation delay of transistor 34 and is preferably independent of process and temperature.

The positive input to operational amplifier 70 is coupled to the drain of transistor 64 at node 68. The output of amplifier 70 is coupled to the gate of transistor 72. Like transistors 34 and 64, transistor 72 is an n-channel device. The source of transistor 72 is coupled to the negative input of amplifier 70 at node 73 and to ground through resistor 74. In this manner, the output of amplifier 70 provides feedback to the negative input of amplifier 70. In a preferred embodiment, amplifier 70 is manufactured on the same wafer as transistor 34.

Transistors 80 and 82 are p-channel transistors configured as a current mirror, as is known in the art. The gates of transistors 80 and 82 are coupled to each other as well as to the drain of transistor 80 and the drain of transistor 72. The sources of transistors 80 and 82 are coupled to each other as well as to supply the power supply voltage, VDDA. The drain of transistor 82 is coupled to another current mirror which comprises current source 52.

Figure 7:
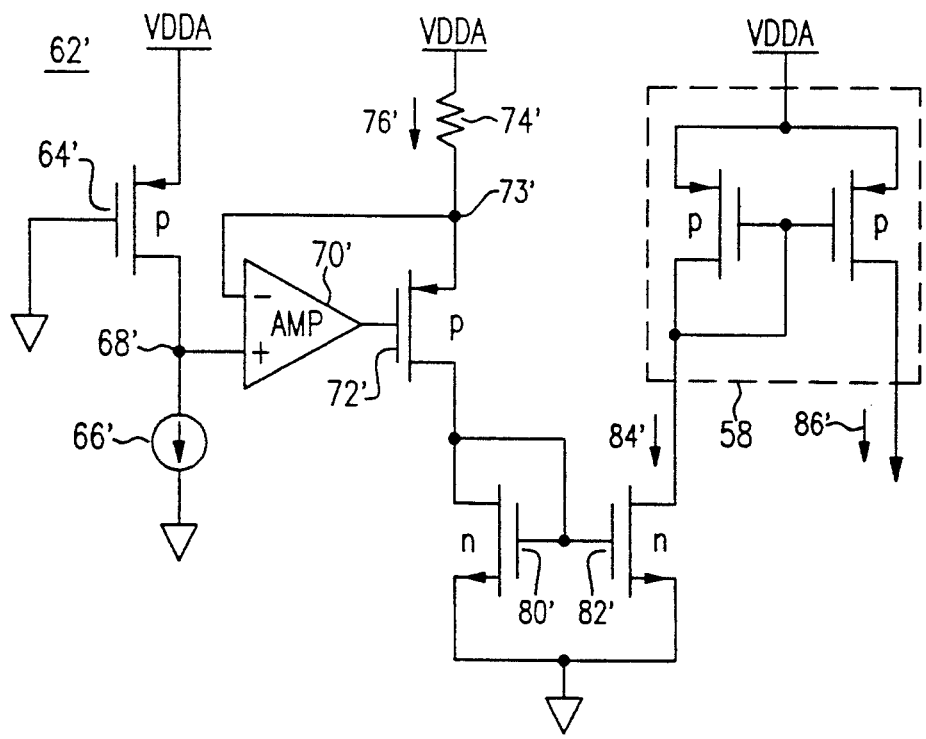
FIG. 7 is a schematic diagram, similar to FIG. 6, showing a current bias for a p-channel transistor.

Current source 58 is shown schematically in FIG. 7 as part of a modeling circuit 62' that models the operation of transistor 36. Circuit 62' is generated from circuit 62 by replacing the n-channel transistors with p-channel transistors and vise-versa, reversing the ground and power supply, and calculating a resistance value for resistor 74' in the manner described below for resistor 74.

During operation, node 38 of logic 32 will charge capacitor 40 to VDDA through transistor 36 or discharge capacitor 40 to ground through transistor 34, when the input signal activates respectively transistor 36 or 34. Only a low-to-high input transition will be described in detail here. With this explanation, one skilled in the art will be able to understand the operation due to a high-to-low transition. During a low-to-high transition on the input gates of transistors 34 and 36, transistor 34 acts as a current source discharging capacitor 40 to ground.

Figure 4:
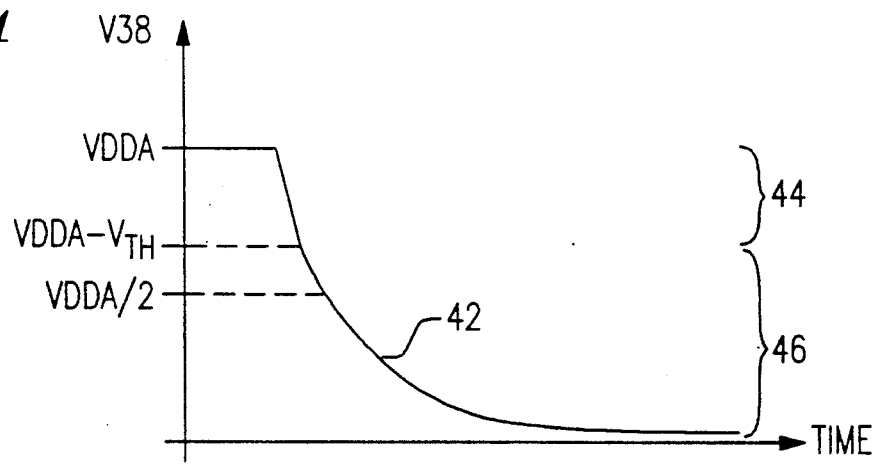
FIG. 4 is a graph showing an output waveform.

Voltage waveform 42 shown in FIG. 4 represents the voltage at node 38 of inverter 32 as capacitor 40 discharges to ground. The linear ramp portion designated 44 results from transistor 34 operating in saturation and functioning as a constant current source. The exponential portion designated 46 results from transistor 34 operating in the triode region. To maximize noise margin, CMOS logic switching threshold is typically set at one-half the supply voltage, with the elapsed time from when the input voltage changes state until the output crosses the switching threshold being defined as propagation delay. The propagation delay introduced by transistor 34 is given by:

$$T\text{prop.inv} \approx C40 \frac{VDDA/2}{I48} \qquad (1)$$

where C40 is the capacitance of capacitor 40, I48 is current 48 and VDDA is the power supply voltage.

From equation (1) it can be seen that the propagation delay of transistor 34 is a function of the power supply voltage driving transistor 34, the magnitude of capacitance 40 and the current discharging capacitor 40. The power supply voltage is determined by design as is the number of transistors represented by transistor 34. The device parameters which determine the structure of transistor 34 are fixed once transistor 34 is manufactured. The parasitic capacitance represented by capacitor 40 is also fixed. While the propagation delay of logic 32 is not compensated, it should be noted that the propagation delay of such logic can be controlled by controlling current 48 discharging capacitance 40. A larger current will result in a quicker change and a smaller propagation delay whereas a smaller current will result in a slower change and a larger propagation delay.

Propagation delay has been used with reference to a delay introduced in a signal path by a single component. The meaning of propagation delay should not be so limited. Delay cell 50 produces a variable, controlled propagation delay that is in series with the propagation delay of logic 32, as shown in FIG. 2, to compensate for various delays in the entire signal path to assure the total propagation delay is within a predetermined range.

Delay cell 50 shown in FIG. 5 operates in a manner similar to logic 32. Transistors 54 and 56 operate as switches to turn on or off respective current sources 52 and 58. Current sources 52 and 58 provide control currents 86 and 86' respectively to transistors 54 and 56 to control the propagation delay introduced by delay cell 50.

As shown schematically in FIG. 6, operational amplifier 70 drives transistor 72 which is a voltage follower that also provides a high impedance current source to drive the bias current mirror of transistors 80 and 82. Amplifier 70 is a high input impedance amplifier that maintains the voltage across resistor 74 at the voltage of the positive input to amplifier 70, node 68, which is also the drain voltage of transistor 64. Since transistors 80 and 82 are identical and have the same gate-to-source voltage, current 84 is the same magnitude as current 76 through resistor 74. While only a single current mirror set has been represented as a current source in the current mirror, those skilled in the art will recognize that additional current mirror sets could be incorporated in the current source.

Transistor 64 of modeling circuit 62 is manufactured to be substantially identical to transistor 34 of logic 32 so as to be a model of transistor 34. The drain-to-source voltage developed across transistor 64 inherently includes variations due to power supply voltage fluctuations, junction temperature, doping levels, and electron mobility, as well as manufacturing variations and other circuit conditions and process characteristics. Collectively these and similar known dc parameters that influence the operation of a transistor will be referred to as circuit conditions and process speed. Transistor 64 develops a drain-to-source voltage indicative of the circuit conditions and process characteristics of transistor 34 due to being manufactured to be substantially identical to transistor 34 and having its gate tied to the power supply voltage. Since the voltage at the output of amplifier 70, specifically at node 73, tracks the voltage at node 68, circuit conditions and process speed variations are inherent in the voltage across resistor 74, current 76 passing through resistor 74, current 84 generated by the current mirror, and in the current 86 generated by current source 52 as it mirrors current 84 to control the discharge of capacitor 41 in delay cell 50.

Since transistor 64 models transistor 34, currents 76, 84 and 86 are variable currents that are dependent on the operating conditions of transistor 34. As circuit conditions and process speed result in increased logic speed, for example due to increased electron mobility, decreases in junction temperature or increases in power supply voltage, the drain-to-source voltage developed at node 68 is reduced. As a result, the voltage at node 73 across resistor 74 is lower, current 76 is lower, current 84 is lower and the current 86 mirrored by current source 52 is lower. This results in a longer propagation delay for delay cell 50. As circuit conditions and process speed result in decreased logic speed, for example due to an increase in junction temperature, or a decrease in power supply voltage, the drain-to-source voltage developed at node 68 increases, resulting in a larger voltage at node 73 across resistor 74, a larger current 76, a larger current 84 and correspondingly a larger current 86 mirrored by current source 52 to provide an appropriate compensating propagation delay for delay cell 50. In this manner, the magnitude of currents 76, 84 and 86 are inversely proportional to the circuit conditions and process speed of transistor 64 and hence transistor 34. Furthermore, variations in the circuit conditions and process characteristics are inherently incorporated in current 86 to compensate for variations in propagation delay. In this manner, transistor 64 senses the circuit conditions and process speed and modeling circuit 62 generates a continuously adaptive bias current 86 to adjust the duration of the delay cell propagation time to be proportional to circuit conditions and process speed.

The magnitude of resistor 74 is determined by first determining the total time delay desired, which determines the circuit parameters of the time delay cell and current 86. The dc parameters of transistor 64 and current 66 determine the voltage at node 68. The voltage at node 73 tracks the voltage at node 68, and current 76 is set by the current mirrors so current 86 will flow. The magnitude of resistor 74 is V73/I76.

Transistor 64 operating in the triode mode can be represented as $$I66 = kp\left(\frac{W}{L}\right)V_{ds}\left(V_{gs} - V_{TH} - \frac{V_{ds}}{2}\right) \quad (2)$$

Where kp contains the carrier mobility and gate oxide thickness term, W and L are the device electrical width and length respectively, $V_{TH}$ is the device threshold voltage, $V_{gs}$ is the gate-to-source voltage, and $V_{ds}$ is the drain-to-source voltage.

Solving for $V_{ds}$ when $V_{ds} << V_{gs} - V_{TH}$ and substituting the voltages from FIG. 6, $V_{ds} = V68$ and $V_{gs} = VDDA$, $$V68 \approx \frac{I66}{kp\frac{W}{L}(VDDA - V_{TH})} \quad (3)$$

Furthermore since the propagation delay of cell 50 is proportional to the time required to discharge capacitor C41, $$Tprop.delay\ cell \approx \frac{C41(VDDA/2)}{I52} \approx \quad (4)$$

$$C41\left(\frac{VDDA}{2}\right)R74\left[\frac{kp\left(\frac{W}{L}\right)(VDDA - V_{TH})}{I66}\right]$$

where I52 is equal to I76 for this example.

For CMOS uncompensated logic, $$Tprop.logic \approx \frac{C40(VDDA/2)}{I48} \approx \quad (5)$$

$$\frac{C40(VDDA/2)}{kp\left[\left(\frac{W}{L}\right)(VDDA - V_{TH})^2\right]}$$

The total propagation delay for the bus buffer is the sum of the two individual delays, and may be written as:

$$Tprop.(logic\ \&\ delay\ cell) \approx \frac{K1(VDDA)}{kp\left(\frac{W}{L}\right)(VDDA - V_{TH})^2} + \quad (6)$$

$$K2(kp)\left(\frac{W}{L}\right)(VDDA - V_{TH})VDDA$$

For a given power supply voltage, equation (6) simplifies to $$Tprop.(logic\ \&\ delay\ cell)^{\sim} \approx \frac{K1'}{kp\left(\frac{W}{L}\right)} + K2'kp\left(\frac{W}{L}\right) \quad (7)$$

For a given process speed $$\left(kp\frac{W}{L}\ factor\right)$$

and for $VDDA >> V_{TH}$, equation (6) simplifies to $$T_{prop.(logic \& delay cell)} \approx \frac{K1''}{VDDA} + K2''(VDDA)^2 \quad (8)$$

where K1, K1' and K1" represent the portion of the total bus buffer time delay contributed by uncompensated logic 32 and K2, K2', and K2" represent the portion of the total bus buffer time delay contributed by delay cell 50. The contribution of the uncompensated logic 32 (K1 terms) to the bus buffer time delay is inversely proportional to increasing process speed, as shown in equations (6) and (7), and increasing power supply voltage, as shown in equations (6) and (8). In contrast, the delay cell contribution (K2 terms) to the bus buffer time delay is proportional to increasing circuit speed, as shown in equations (6) and (7), and increasing power supply voltage, as shown in equations (6) and (8).

FIG. 7 shows a modeling circuit 62' similar to modeling circuit 62 to generate current 86' by current source 58. Operation of modeling circuit 62' will be readily understood by those skilled in the art in view of the above explanation of the operation of circuit 62.

Figure 8:
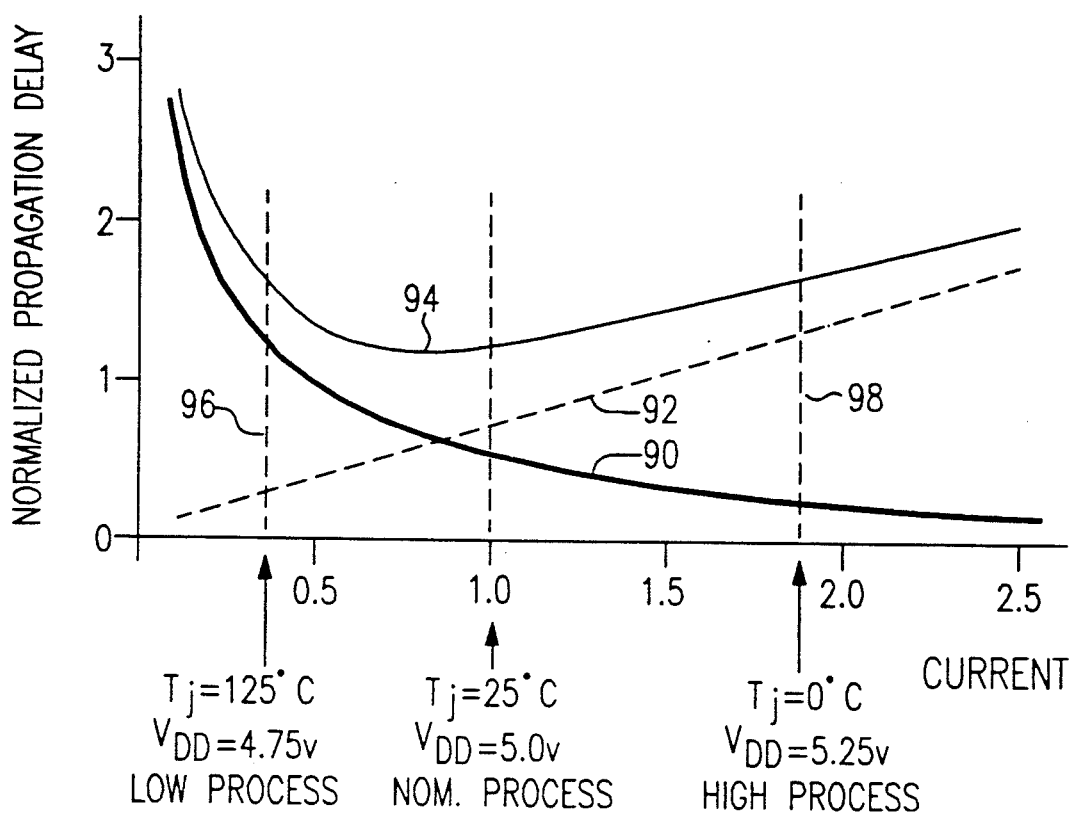
FIG. 8 is a graph showing the normalized propagation delay of the bus buffer as the sum of the propagation delay of the uncompensated logic inverter and the compensated delay cell.

FIG. 8 is a graph showing normalized propagation delay as a function of process and operating conditions. Ideally, compensation of the propagation delay would provide a uniform delay across all parameter variations.

Curve 90 represents the uncompensated propagation delay of the logic 32. As can be seen from the vertical axis, variations in circuit conditions and process speed can cause up to a five-to-one variation in propagation delay for uncompensated logic. This is the contribution of the K1 term of equation (6) to the total propagation delay for the bus buffer. Curve 90 is nonlinear and decreases as the circuit conditions and process speed become faster. The longest propagation delay occurs at low circuit conditions and process speed.

Curve 92 represents the compensated time delay cell propagation delay variation due to circuit conditions and process characteristics. The time delay due to circuit conditions and process speed varies proportionally with circuit conditions and process speed and thus increases as the process becomes faster. This is the contribution of the K2 term of equation (6) to the total propagation delay for the bus buffer.

Curve 94 represents the normalized propagation delay of a bus buffer, with compensation, to assure that the compensated propagation delay falls within an acceptable, predetermined time range. The total propagation delay for the bus buffer is the sum of the propagation delays of logic 32 and the delay cell 50, the sum of the terms of equation (6), or equivalently, the sum of curves 90 and 92 represented by curve 94. Lower limit 96 and upper limit 98 represent the extremes of operation of interest.

In the region between lower limit 96 and upper limit 98 where the uncompensated delay of a time cell dominates, that is where the propagation delay represented by curve 90 is greater than the propagation delay represented by curve 92, the normalized propagation delay, curve 94, decreases as the circuit conditions and process speed result in faster uncompensated logic speed. However, where the propagation delay due to the delay cell dominates, that is where the propagation delay represented by curve 92 is greater than the propagation delay represented by curve 90, the normalized propagation delay, curve 94, increases as the circuit conditions and process becomes faster.

Figure 9:
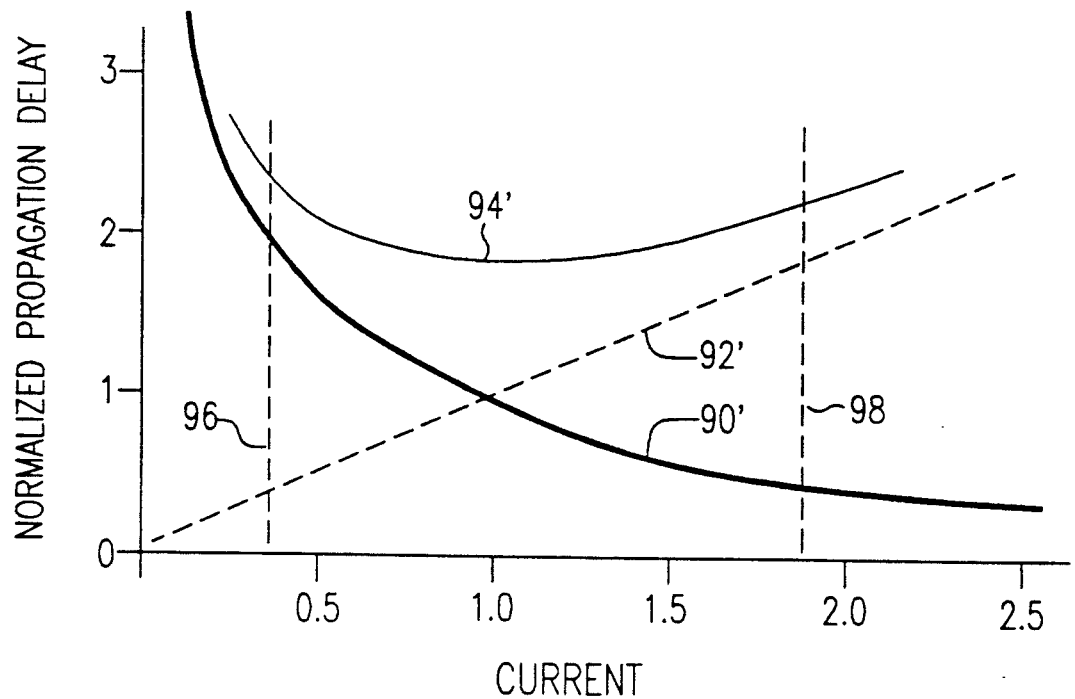
FIG. 9 is a graph similar to FIG. 8 in which the relative contribution of each delay to the total propagation delay has been changed.

The relative contribution of each term to the total propagation delay can be varied by changing the relative magnitudes of K1 and K2. FIG. 9 shows a graph of normalized propagation delay similar to FIG. 8 in which both the contribution to the total propagation delay by each of the inverter and the delay cell have been changed. The contribution by the inverter has been changed, by modifying the C40/I48 ratio, and is designated as curve 90'. The delay contributed to the total propagation delay by the delay cell has been changed, by modifying R74, and is designated as curve 92'. The total propagation delay is designated 94'. In this manner, the total propagation delay can be designed to fall within a predetermined range.

The present invention provides a delay compensation technique that may provide a shorter propagation delay in the middle of the range of parameter variations than at either extreme end of the range of interest. Leads provide means for conducting signals onto the integrated circuit. Subsequent to passing through the series delays, delayed signals may be either further processed on the integrated circuit or conducted from the integrated circuit by leads.

While the invention has been described as having application transferring digital data to and from a bus, the invention may also be used in applications where a relatively uniform time delay is desired.

Other embodiments of the invention will be apparent to those skilled in the art, for example the inventive principles have application in logic manufactured by other processes, including p-type metal oxide semiconductor (PMOS) and n-type metal oxide semiconductor (NMOS). In addition, an embodiment of the invention may be employed at a system level.

I claim:

1. An integrated circuit for processing signals, comprising:
    a first circuit introducing a first time delay to at least one of the signals, the duration of the first time delay decreasing as circuit conditions and process speed become faster;
    a second circuit including a switching device, the second circuit introducing a second time delay to said at least one of the signals resulting in a delayed signal, the second circuit in series with the first circuit, the duration of the second time delay determined by a control signal, the duration of the second time delay increasing as the net effect of circuit conditions and process speed become faster; and
    a third circuit for sensing circuit conditions and process speed of the switching device and for generating said control signal to regulate the duration of the second time delay, whereby the total time delay resulting from the sum of the first and second time delays remains within a predetermined range and is generated without feedback by sensing the dc parameters that affect circuit conditions and process speed.

2. An integrated circuit for processing signals, comprising:
    a first circuit introducing a first time delay to at least one of the signals, the duration of the first time delay decreasing as circuit conditions and process speed become faster;
    a second circuit, the second circuit comprising a delay cell having a first field effect transistor driven by a bias current, the second circuit including a switching device, the second circuit introducing a second time delay to said at least one of the signals resulting in a delayed signal, the second circuit in series with the first circuit, the duration of the second time delay determined by a control signal, the second time delay increasing as circuit conditions and process speed become faster; and a third circuit for sensing circuit conditions and process speed of the switching device and for generating said control signal to regulate the duration of the second time delay, the third circuit comprising:

a second field effect transistor adapted to be driven by a first current source;

an operational amplifier having a positive first input coupled to the second transistor and the first current source, an output and a negative second input, the output coupled to the negative second input such that the voltage developed at the output of the operational amplifier tracks the voltage at the positive input;

an impedance coupled between the operational amplifier output and a voltage reference; and a second current source for developing the bias current to drive the first transistor, the second current source coupled to the operational amplifier output and the impedance, whereby the voltage developed at the positive first input of the operational amplifier is indicative of the circuit conditions and process speed variations under which the second transistor is operating, the bias current inherently incorporating effects of these conditions to drive the first transistor and hence control the second time delay in response thereto such that the total time delay resulting from the sum of the first and second time delays remains within a predetermined range and is generated without feedback by sensing the dc parameters that affect circuit conditions and process speed.

3. An integrated circuit as recited in claim 2, wherein the second current source comprises a current mirror.

4. An integrated circuit as recited in claim 2, wherein the voltage reference is ground.

5. An integrated circuit as recited in claim 2 further comprising a third field effect transistor coupled to the operational amplifier output, the second current source and the impedance, the gate of the third transistor being coupled to the operational amplifier output and the drain and source being coupled between the second current source and the impedance.

6. An integrated circuit as recited in claim 2, further comprising:

leads coupled to the integrated circuit for conducting signals onto the integrated circuit; and leads coupled to the integrated circuit for conducting the delayed signals from the integrated circuit.

7. An integrated circuit as recited in claim 2, further comprising additional circuitry on the integrated circuit for further processing the delayed signals.

8. An integrated circuit as recited in claim 2, wherein the first circuit further comprises a fourth field effect transistor, the second and fourth transistors being substantially identical.

9. An integrated circuit for processing signals, comprising:

a first circuit including a transistor, the first circuit introducing a first signal propagation time delay;

a second circuit in series with the first circuit, said second circuit introducing a bias current controlled second signal propagation time delay resulting in delayed signals; and a bias current generating circuit for modeling the operation of the transistor and for generating a continuously adaptive bias current dependent on circuit conditions and process speed variations under which the transistor operates, the bias current for controlling the duration of the second time delay, whereby the modeling directly senses the dc parameters that affect circuit conditions and process speed and varies the second time delay in response thereto such that the total time delay resulting from the sum of the first and second time delays remains within a predetermined range.

10. An integrated circuit as recited in claim 9, wherein the bias current generating circuit generates a bias current that is inversely proportional to circuit conditions and process speed.

11. An integrated circuit as recited in claim 9, wherein the contribution of the first time delay to the total time delay is defined by a first scale factor and the contribution of the second time delay to the total time delay is defined by a second scale factor, the first and second scale factors being independent.

12. A method of controlling the propagation delay in a signal path of an integrated circuit, comprising the steps of:

conducting a signal onto the integrated circuit;

introducing a first time delay to the signal, the first time delay having a duration that decreases as circuit conditions and process speed become faster;

introducing a second time delay to the signal, the second time delay having a duration that increases as circuit conditions and process speed become faster, the second time delay being in series with the first time delay;

sensing circuit conditions and process speed of a switching device on the integrated circuit; and varying the duration of the second time delay in response to the sensed circuit conditions and process speed, whereby the duration of the second time delay is varied in response to the sensed circuit conditions and process speed such that the total time delay resulting from the sum of the first and second time delays remains within a predetermined range.

13. A method of controlling the propagation delay as recited in claim 12, further comprising the step of:

generating a bias current based on the sensed circuit conditions and process speed to control the duration of the second time delay.

14. A buffer system for controlling the time delay of a signal passing therethrough comprising:

a first circuit introducing a first time delay to the signal, the duration of the first time delay decreasing as circuit conditions and process speed become faster;

a second circuit including a switching device, the second circuit introducing a second time delay to the signal resulting in a delayed signal, the second circuit in series with the first circuit, the duration of the second time delay determined by a control signal, the duration of the second time delay increasing as the net effect of circuit conditions and process speed become faster; and a third circuit for directly sensing circuit conditions and process speed of the switching device and for generating a control signal to regulate the duration of the second time delay whereby the total time delay resulting from the sum of the first and second time delays remains within a predetermined range and is generated sensing the dc parameters that affect circuit conditions and process speed.

15. A buffer system for controlling the time delay of a signal passing therethrough comprising:
- a first circuit comprising a first field effect transistor introducing a first time delay to the signal, the duration of the first time delay decreasing as circuit conditions and process speed become faster;
- a second circuit including a switching device, the second circuit introducing a second time delay to the signal resulting in a delayed signal, the second circuit in series with the first circuit, the duration of the second time delay determined by a control signal, the second time delay increasing as circuit conditions and process speed become faster; and
- a third circuit comprising a second field effect transistor for directly sensing circuit conditions and process speed of the switching device and for generating a control signal to regulate the duration of the second time delay whereby the total time delay resulting from the sum of the first and second time delays remains within a predetermined range and is generated sensing the dc parameters that affect circuit conditions and process speed, wherein the first and second transistors are manufactured to be substantially identical.

* * * * *